(12) United States Patent
Iwasaki et al.

(10) Patent No.: US 11,694,727 B2
(45) Date of Patent: *Jul. 4, 2023

(54) MEMORY DEVICES INCLUDING HEATERS

(71) Applicant: MICRON TECHNOLOGY, INC., Boise, ID (US)

(72) Inventors: Tomoko Ogura Iwasaki, San Jose, CA (US); Foroozan Koushan, Fremont, CA (US); Jayasree Nayar, Pleasanton, CA (US); Ji-Hye Gale Shin, Palo Alto, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,903

(22) Filed: Jul. 18, 2022

(65) Prior Publication Data

US 2022/0351755 A1 Nov. 3, 2022

Related U.S. Application Data

(63) Continuation of application No. 17/181,125, filed on Feb. 22, 2021, now Pat. No. 11,417,368.

(60) Provisional application No. 63/126,009, filed on Dec. 16, 2020.

(51) Int. Cl.
*G11C 5/02* (2006.01)
*H10B 41/35* (2023.01)
*H10B 41/41* (2023.01)
*H10B 43/35* (2023.01)

(52) U.S. Cl.
CPC ............. *G11C 5/025* (2013.01); *H10B 41/35* (2023.02); *H10B 41/41* (2023.02); *H10B 43/35* (2023.02); *G11C 2213/75* (2013.01)

(58) Field of Classification Search
CPC ............... G11C 5/025; G11C 2213/75; H01L 27/11524; H01L 27/11529; H01L 27/1157
USPC ................................................ 365/185.17
See application file for complete search history.

(56) References Cited

U.S. PATENT DOCUMENTS

| 9,761,290 | B1 | 9/2017 | Kankani et al. |
| 10,984,211 | B1 | 4/2021 | Lin et al. |
| 11,417,368 | B2 * | 8/2022 | Iwasaki ............. H01L 27/11529 |
| 2009/0196115 | A1 | 8/2009 | Agari et al. |
| 2012/0281478 | A1 | 11/2012 | Lue et al. |

OTHER PUBLICATIONS

Lue, Hang-Ting, et al. "Radically Extending the Cycling Endurance of Flash Memory (to >100M Cycles) by Using Built-In Thermal Annealing to Self-heal the Stress-induced Damage," IEDM12-200, pp. 1-4, 2012.

* cited by examiner

*Primary Examiner* — Huan Hoang
(74) *Attorney, Agent, or Firm* — Dicke, Billig & Czaja, PLLC

(57) ABSTRACT

Memory devices might include an array of memory cells, a plurality of access lines, and a heater. The array of memory cells might include a plurality of strings of series-connected memory cells. Each access line of the plurality of access lines might be connected to a control gate of a respective memory cell of each string of series-connected memory cells of the plurality of strings of series-connected memory cells. The heater might be adjacent to an end of each access line of the plurality of access lines.

20 Claims, 11 Drawing Sheets

MEMORY DEVICES INCLUDING HEATERS

RELATED APPLICATIONS

This application is a Continuation of U.S. application Ser. No. 17/181,125, titled "MEMORY DEVICES INCLUDING HEATERS," filed Feb. 22, 2021, now U.S. Pat. No. 11,417,368 issued on Aug. 16, 2022, which is commonly assigned and incorporated herein by reference in its entirety, and which claims the benefit of U.S. Provisional Application No. 63/126,009, filed on Dec. 16, 2020, hereby incorporated herein in its entirety by reference.

TECHNICAL FIELD

The present disclosure relates generally to memory and, in particular, in one or more embodiments, the present disclosure relates to memory devices including heaters.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Oxide within memory devices may degrade due to program/erase cycles. The oxide degradation may increase the number of defects (e.g., traps) in the oxide at the interface and the space between the gates of the memory cells. As a result of the oxide degradation, data retention loss may increase to a level where the affected memory cells can no longer be used.

DETAILED DESCRIPTION

Figure 1:
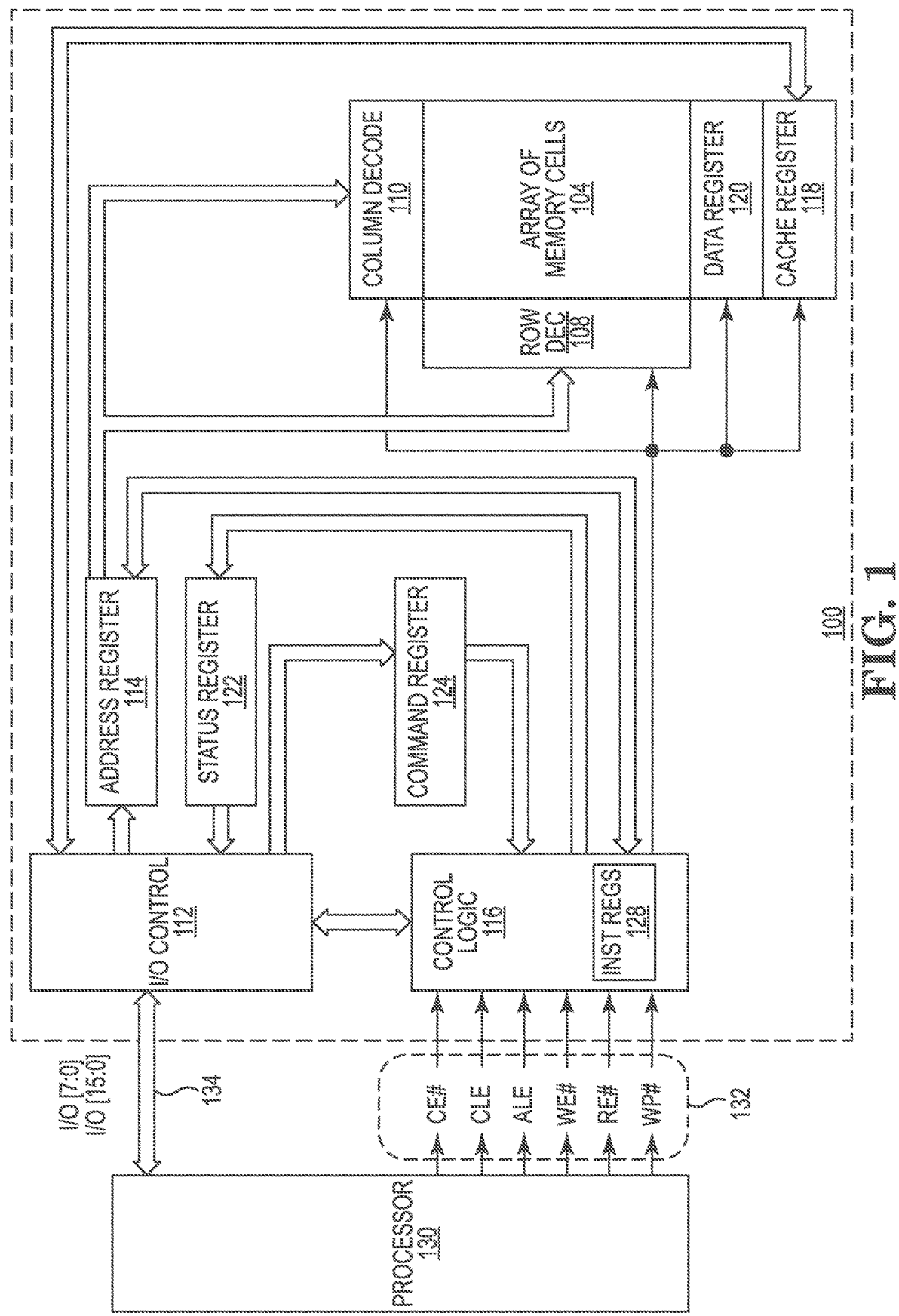
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
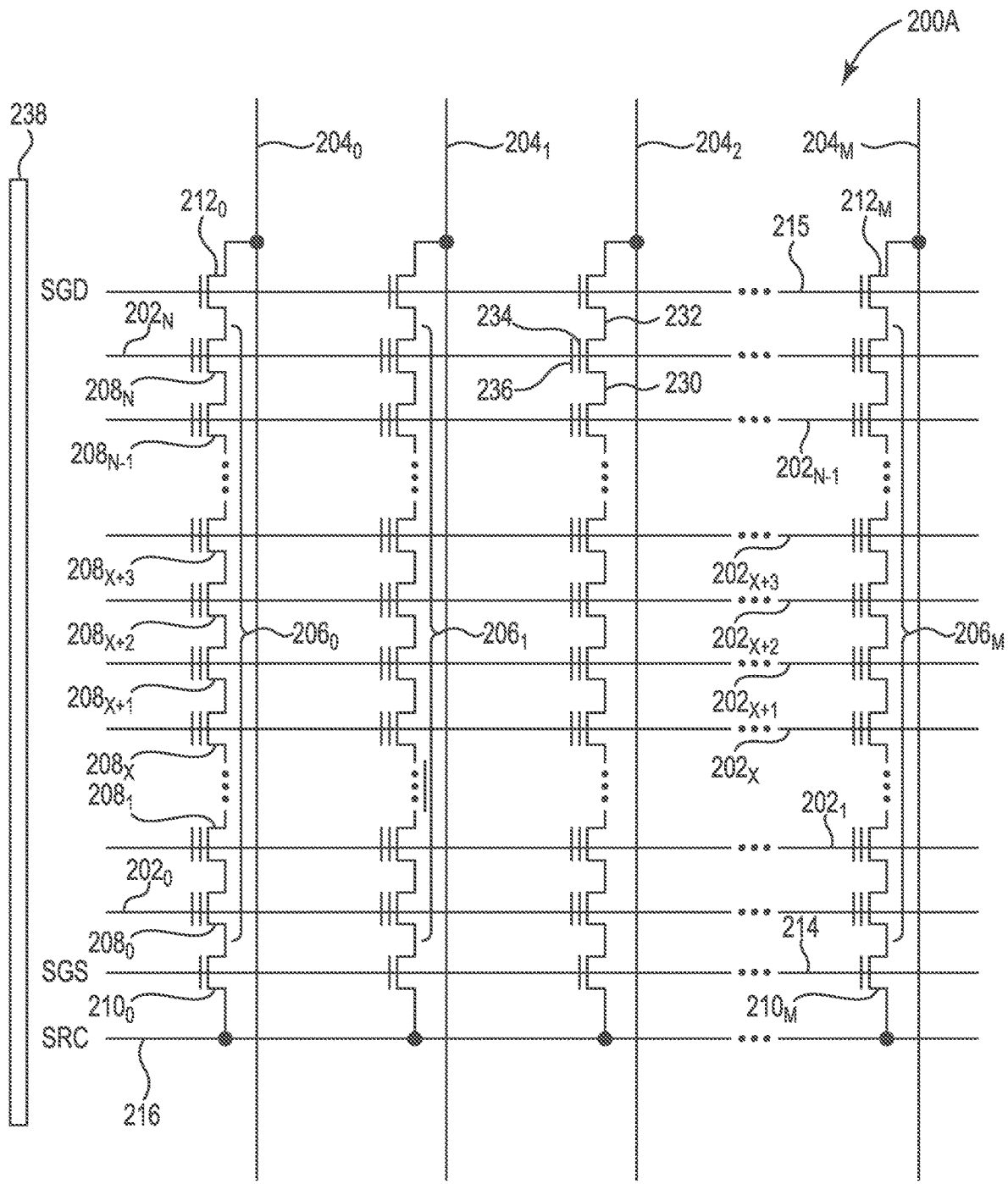
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Array of memory cells 200A may also include a heater 238. Heater 238 might be adjacent to an end of each access line $202_0$ to $202_N$. Heater 238 may be configured to selectively anneal oxide within the NAND strings 206 to mitigate (e.g., remove) defects (e.g., traps) within the oxide. A thermally conductive electrically insulating material may be between the heater 238 and the access lines 202, such that the heater 238 is electrically isolated from the NAND strings 206 and the access lines 202. As will be described in more detail below with reference to the following figures, in one embodiment, heater 238 may include an electrically conductive plate or wall. In another embodiment, heater 238 may include a plurality of electrically conductive through-array vias (TAVs). Heater 238 includes a conductive material. In one embodiment, the heater 238 might include a doped polysilicon. In other embodiments, the heater 238 might include a metal, such as tungsten, or another suitable electrically conductive material.

A switch (not shown) may be electrically coupled to the heater 238 to turn on the heater 238 to selectively anneal oxide within the NAND strings 206 and to turn off the heater 238 once the annealing is complete. The switch might be a bipolar junction transistor, a diode, a complementary metal-oxide-semiconductor (CMOS) transistor, or another suitable switch. In one embodiment, a common or ground node might be electrically coupled to a first side of the heater 238, and the switch might be electrically coupled between a power supply node (e.g., Vcc) and a second side of the heater 238. In another embodiment, a power supply node might be electrically coupled to a first side of the heater 238, and the switch might be electrically coupled between a common or ground node and a second side of the heater 238. In either case, when the switch is turned on, a current passes through the heater 238 from the power supply node to the common or ground node such that the heater 238 generates heat sufficient to anneal oxide within the NAND strings 206.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
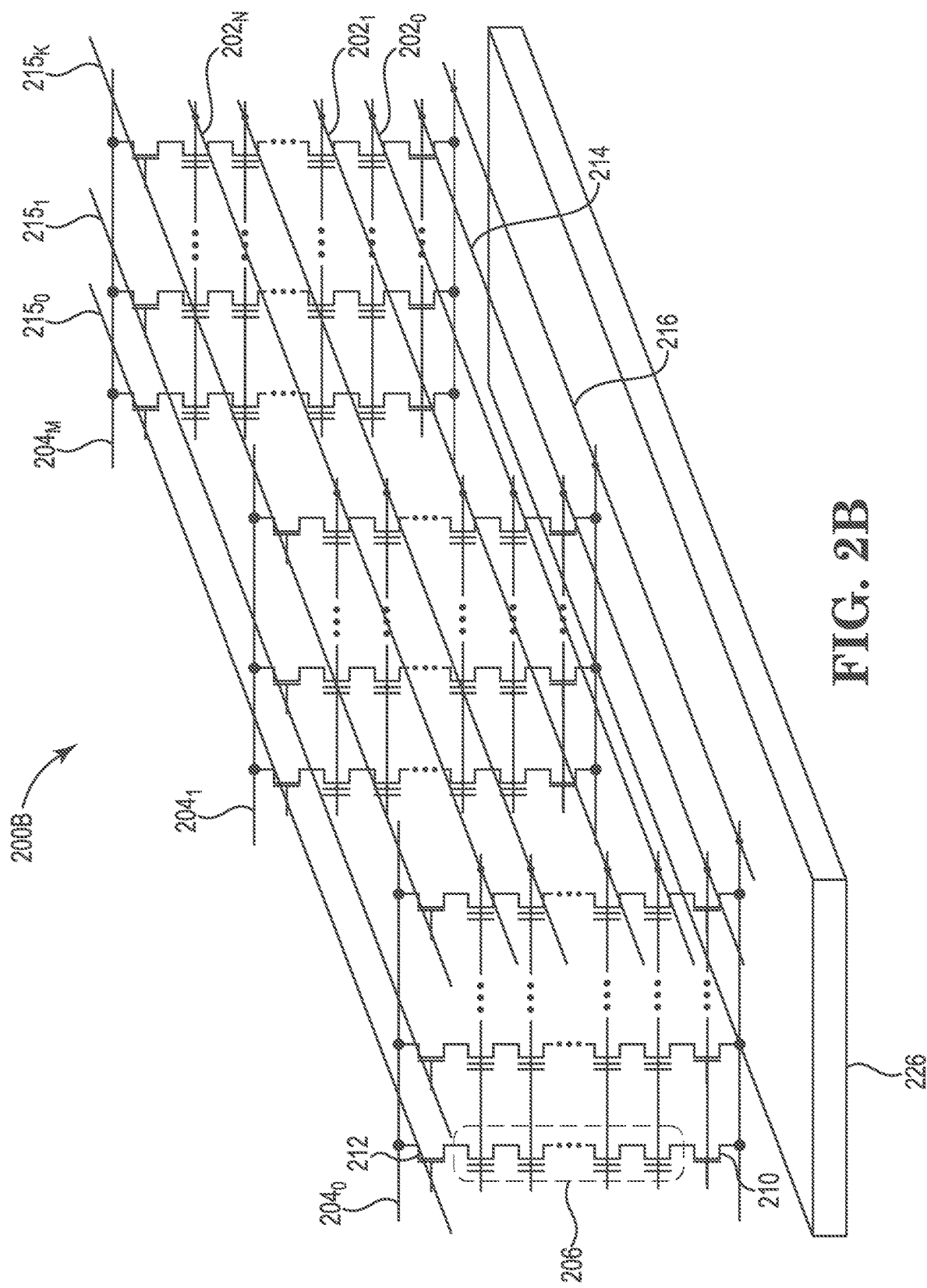

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
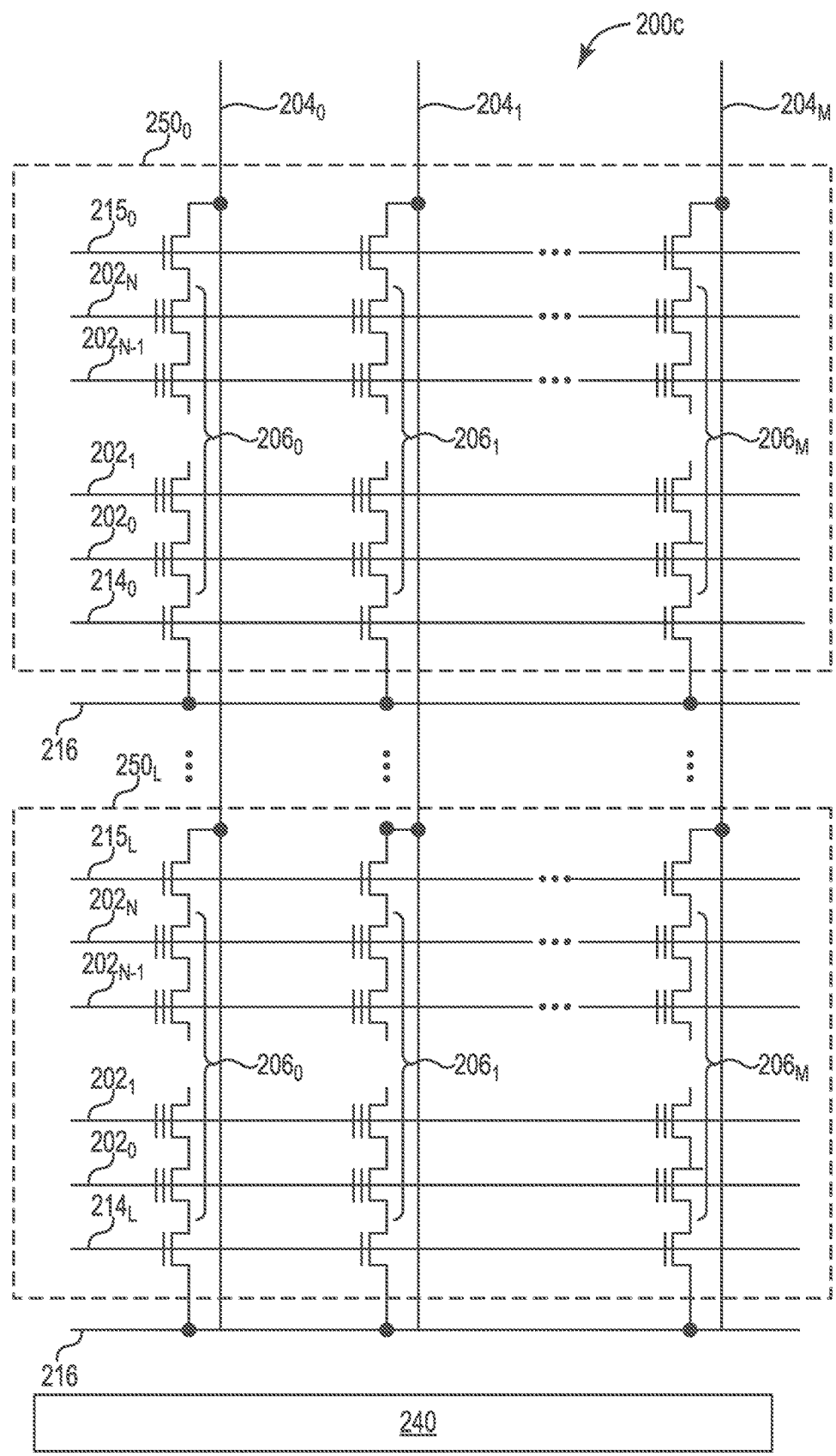

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
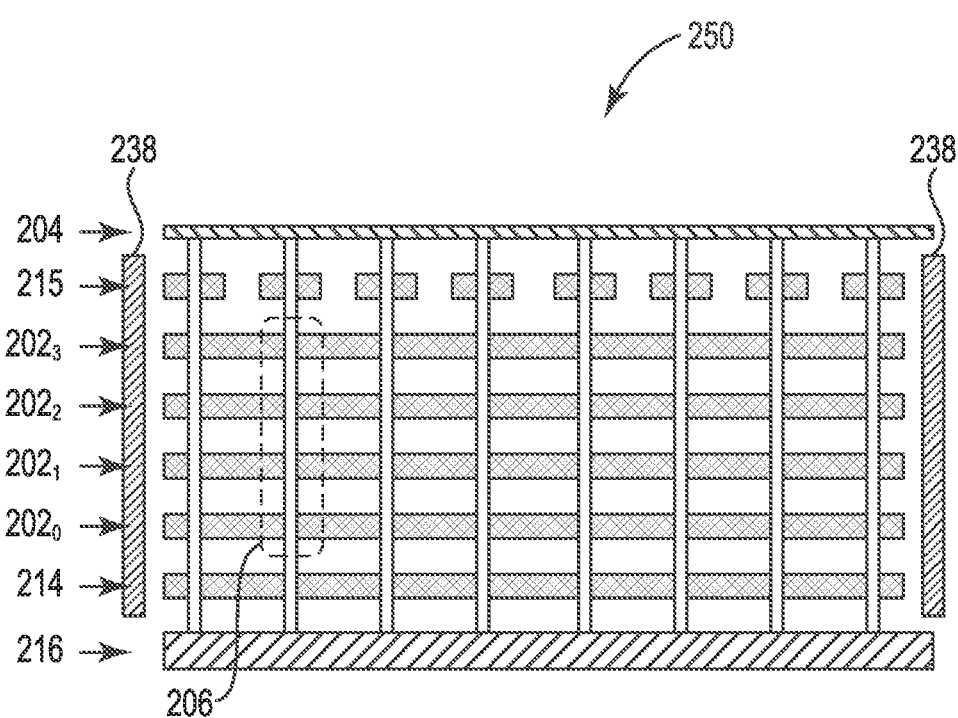
FIG. 3 is a cross-sectional view of a block of memory cells of an array of memory cells as could be used in a memory of the type described with reference to FIG. 1.

FIG. 3 depicts an example cross-section of a block of memory cells 250. The cross-section of block of memory cells 250 includes a data line 204, select lines 214 and 215, a common source 216, and access lines $202_0$-$202_3$. While four access lines 202 are depicted for block of memory cells 250 in FIG. 3, other numbers of access lines 202 may be used. FIG. 3 has been simplified, but it is to be understood that a memory cell may occur at each intersection of an access line 202, and a select gate may occur at each intersection of a select line 214 and 215. Block of memory cells 250 might include a heater 238. While heater 238 is depicted as separate portions on each side of the block of memory cells 250 adjacent to the ends of each access line 202 in the cross-section of FIG. 3, as described below with reference to FIGS. 4A-5B, the separate portions of heater 238 on each side of the block of the memory cells 250 may be connected to each other to form a single heater 238.

The block of memory cells 250 includes a plurality of NAND strings 206, where each NAND string 206 is selectively electrically coupled between a respective data line 204 of a plurality of data lines (one data line is visible in FIG. 3) and the common source 216. Each NAND string 206 of the block of memory cells 250 extends perpendicular to a first plane containing the common source 216 and to a second plane containing the plurality of data lines 204. The heater 238 is adjacent to the block of memory cells 250 and extends perpendicular to the first plane and the second plane.

Figure 4A:
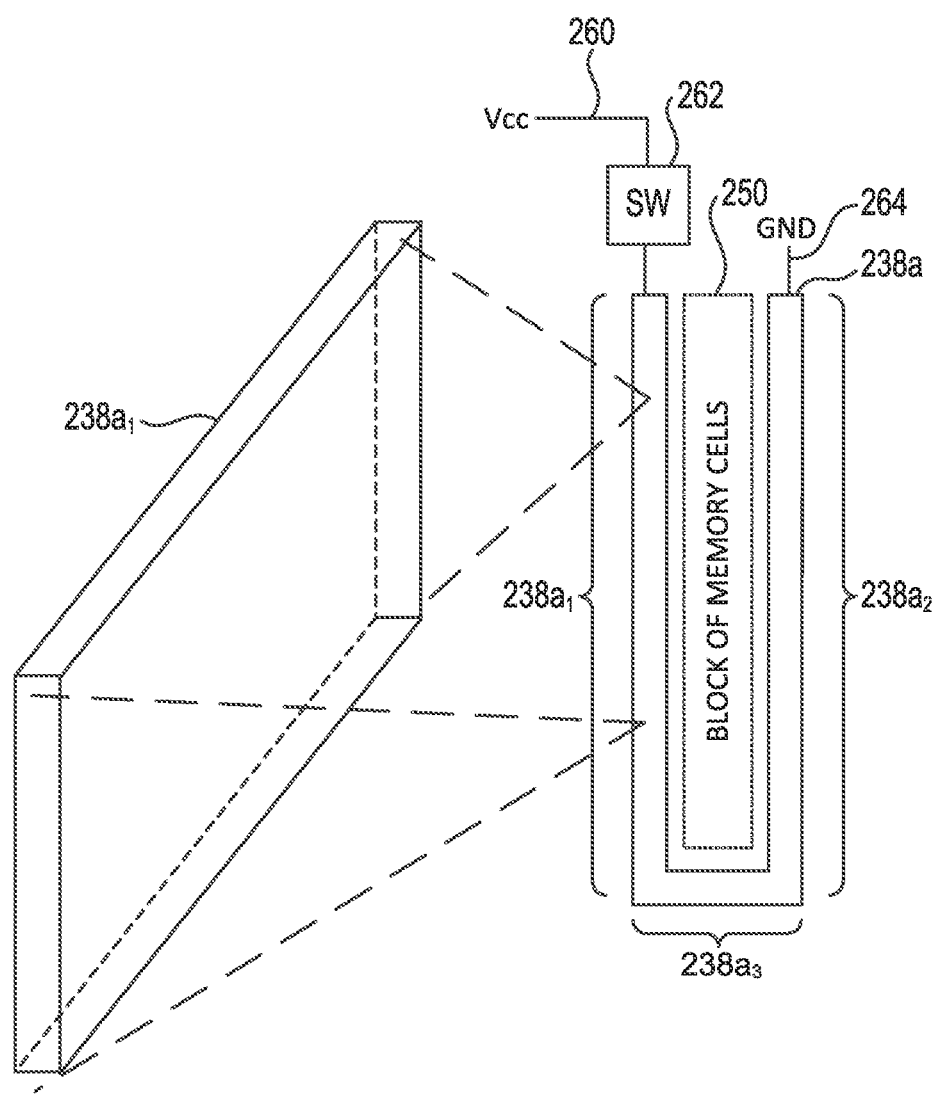
FIGS. 4A and 4B are top views and partial perspective side views of a block of memory cells and a corresponding heater as could be used in a memory of the type described with reference to FIG. 1.

FIG. 4A is a top view and a partial perspective side view of a block of memory cells 250 and a heater 238a. Heater 238a includes a first electrically conductive plate (or wall) $238a_1$ on a first side of the block of memory cells 250, a second electrically conductive plate (or wall) $238a_2$ on a second side of the block of memory cells 250, and a third electrically conductive plate (or wall) $238a_3$ on a third side of the block of memory cells 250 extending between the first electrically conductive plate $238a_1$ and the second electrically conductive plate $238a_2$. The first electrically conductive plate $238a_1$ may be parallel to the second electrically conductive plate $238a_2$, and the third electrically conductive plate $238a_3$ may be perpendicular to the first electrically conductive plate $238a_1$ and the second electrically conductive plate $238a_2$. A power supply node (e.g., Vcc) 260 might be electrically coupled to a first side of a switch 262. A second side of the switch 262 might be electrically coupled to a first side of the heater 238a (e.g., first electrically conductive plate $238a_1$). A common or ground node 264 might be electrically coupled to a second side of the heater 238a (e.g., second electrically conductive plate $238a_2$).

Switch 262 might be a bipolar junction transistor, a diode, a CMOS transistor, or another suitable switch. In the case of a diode, the power supply node 260 and the common or ground node 264 may be selectively biased (e.g., via control logic 116 of FIG. 1) to enable or disable the heater 238a. In this case to enable the heater 238a, the power supply node 260 and the common or ground node 264 may be biased to forward bias the diode to pass a current through the heater 238a to anneal the block of memory cells 250. To disable the heater 238a, the power supply node 260 and the common or ground node 264 may be biased to reverse bias the diode to block a current from passing through the heater 238a.

In the case of a transistor or other type of switch, a control input of the switch 262 (not shown) may be controlled (e.g., via control logic 116 of FIG. 1) to enable or disable the heater 238a. In this case to enable the heater 238a, the transistor or other type of switch is turned on to pass a current through the heater 238a to anneal the block of memory cells 250. To disable the heater 238a, the transistor or other type of switch is turned off to block a current from passing through the heater 238a.

Figure 4B:
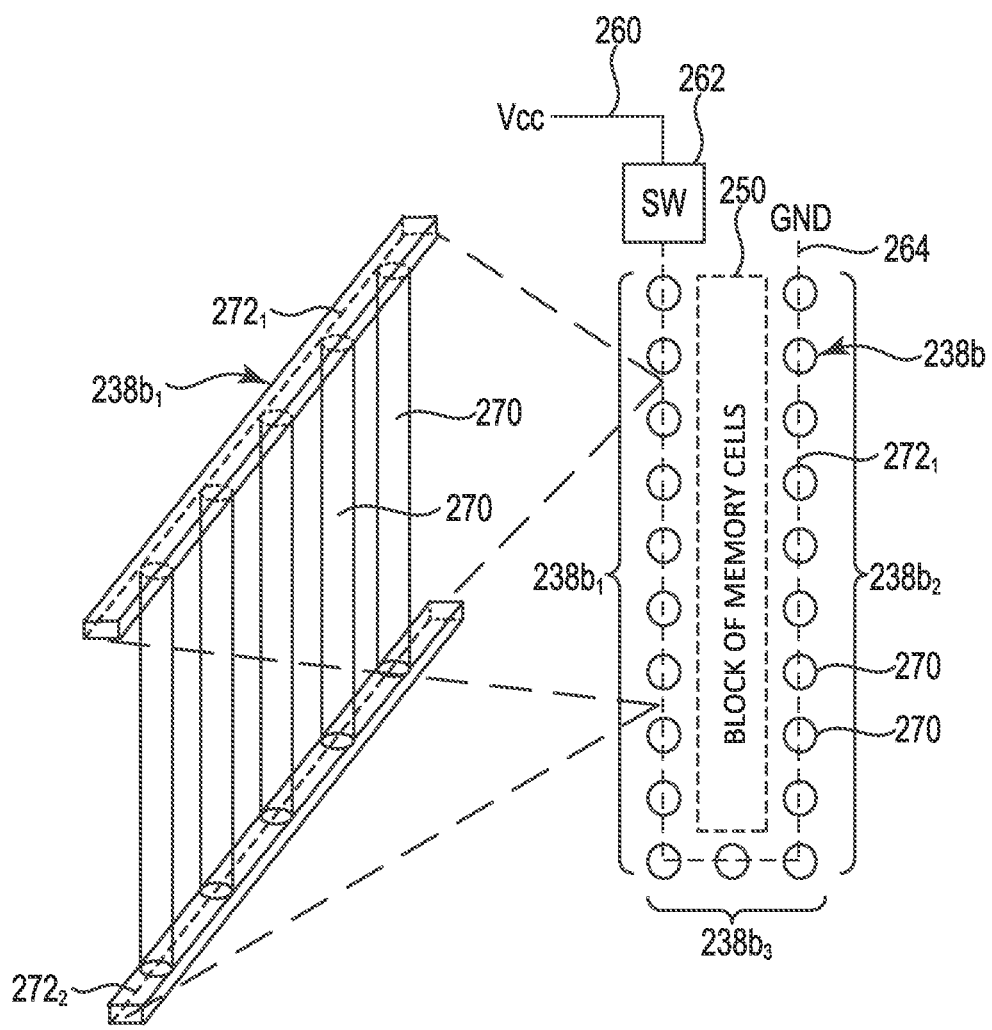

FIG. 4B is a top view and a partial perspective side view of a block of memory cells 250 and a heater 238b. Heater 238b includes a first plurality $238b_1$ of electrically conductive TAVs 270 on a first side of the block of memory cells 250, a second plurality $238b_2$ of electrically conductive TAVs 270 on a second side of the block of memory cells 250, and a third plurality $238b_3$ of electrically conductive TAVs 270 on a third side of the block of memory cells 250 extending between the first plurality $238b_1$ of electrically conductive TAVs 270 and the second plurality $238b_2$ of electrically conductive TAVs 270. The first plurality $238b_1$ of electrically conductive TAVs 270 may be parallel to the second plurality $238b_2$ of electrically conductive TAVs 270, and the third plurality $238b_3$ of electrically conductive TAVs 270 may be perpendicular to the first plurality $238b_1$ of electrically conductive TAVs 270 and the second plurality $238b_2$ of electrically conductive TAVs 270. A power supply node (e.g., Vcc) 260 might be electrically coupled to a first side of a switch 262. A second side of the switch 262 might be electrically coupled to a first side of the heater 238b (e.g., first plurality $238b_1$ of electrically conductive TAVs 270). A common or ground node 264 might be electrically coupled to a second side of the heater 238b (e.g., second plurality $238b_2$ of electrically conductive TAVs 270).

Heater 238b includes a first electrically conductive layer $272_1$ electrically coupling a first side of the first plurality $238b_1$ of electrically conductive TAVs 270, the second plurality $238b_2$ of electrically conductive TAVs 270, and the third plurality $238b_3$ of electrically conductive TAVs 270. Heater 238b also includes a second electrically conductive layer $272_2$ electrically coupling a second side of the first plurality $238b_1$ of electrically conductive TAVs 270, the second plurality $238b_2$ of electrically conductive TAVs 270, and the third plurality $238b_3$ of electrically conductive TAVs 270. Switch 262 may be used to enable or disable heater 238b similarly as described with reference to heater 238a of FIG. 4A. In one example, switch 262 is electrically coupled to the first electrically conductive layer $272_1$, and the common or ground node 264 is electrically coupled to the second electrically conductive layer $272_2$.

Figure 5A:
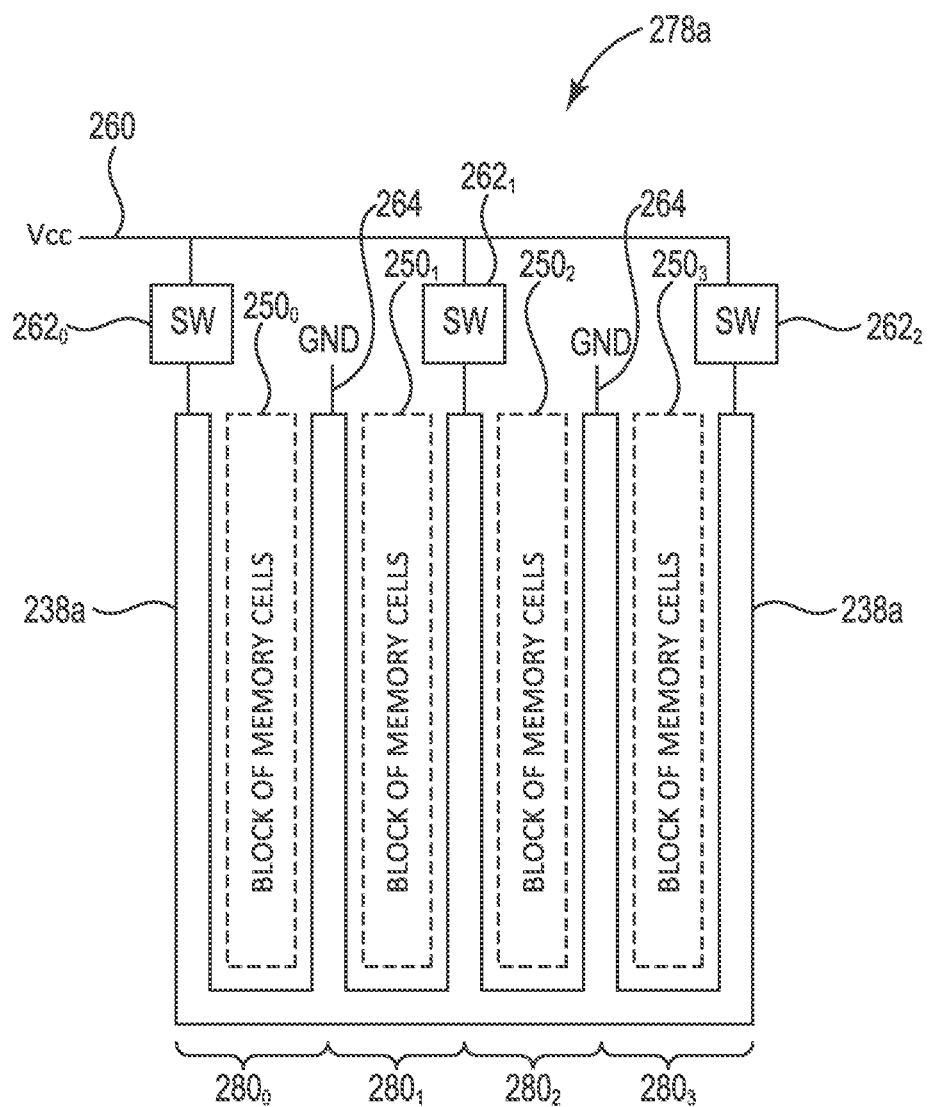
FIGS. 5A and 5B are top views of a plurality of blocks of memory cells and corresponding heaters as could be used in a memory of the type described with reference to FIG. 1.

FIG. 5A is a top view of a memory device 278a including a plurality of blocks of memory cells $250_0$ to $250_3$, respective heaters $280_0$ to $280_3$, and switches $262_0$ to $262_2$. While four blocks of memory cells 250 and four corresponding heaters 280 are shown in FIG. 5A, in other embodiments, the memory device 278a may include another suitable number of blocks of memory cells 250 and corresponding heaters 280. In this embodiment, each heater $280_0$ to $280_3$ is similar to heater 238a previously described and illustrated with reference to FIG. 4A. Each heater $280_0$ to $280_3$ is adjacent to (e.g., partially surrounds) a respective block of memory cells $250_0$ to $250_3$. A subset of heaters (e.g., $280_1$ and $280_2$) include a first side adjacent to a first block of memory cells (e.g., $250_0$ and $250_1$, respectively) and a second side opposite to the first side adjacent to a second block of memory cells (e.g., $250_2$ and $250_3$, respectively). Thus, portions of a heater 280 may be shared by an adjacent heater. In this embodiment, where each heater 280 includes plates or walls, the plate or wall between blocks of memory cells $250_0$ and $250_1$ is shared by both heaters $280_0$ and $280_1$. Likewise, the plate or wall between blocks of memory cells $250_1$ and $250_2$ is shared by both heaters $280_1$ and $280_2$, and the plate or wall between blocks of memory cells $250_2$ and $250_3$ is shared by both heaters $280_2$ and $280_3$.

A power supply node (e.g., Vcc) 260 is electrically coupled to a first side of each switch $262_0$ to $262_2$. A second side of switch $262_0$ is electrically coupled to a first side of heater $280_0$. A second side of heater $280_0$/first side of heater $280_1$ is electrically coupled to a common or ground node 264. A second side of switch $262_1$ is electrically coupled to a second side of heater $280_1$/first side of heater $280_2$. A second side of heater $280_2$/first side of heater $280_3$ is electrically coupled to common or ground node 264. A second side of switch $262_2$ is electrically coupled to a second side of heater $280_3$. In this embodiment, switches 262 are configured such that up to two blocks of memory cells 250 may be annealed at the same time. In other embodiments, switches 262 may be configured such that any suitable number of blocks of memory cells 250 may be annealed at the same time. In the embodiment of FIG. 5A, block of memory cells $250_0$ may be annealed by turning on switch $262_0$ to pass a current through heater $280_0$ from the power supply node 260 to the common or ground node 264. Blocks of memory cells $250_1$ and $250_2$ may be annealed by turning on switch $262_1$ to pass a current through heaters $280_1$ and $280_2$ from the power supply node 260 to the common or ground node 264. Block of memory cells $250_3$ may be annealed by turning on switch $262_2$ to pass a current through heater $280_3$ from the power supply node 260 to the common or ground node 264.

Figure 5B:
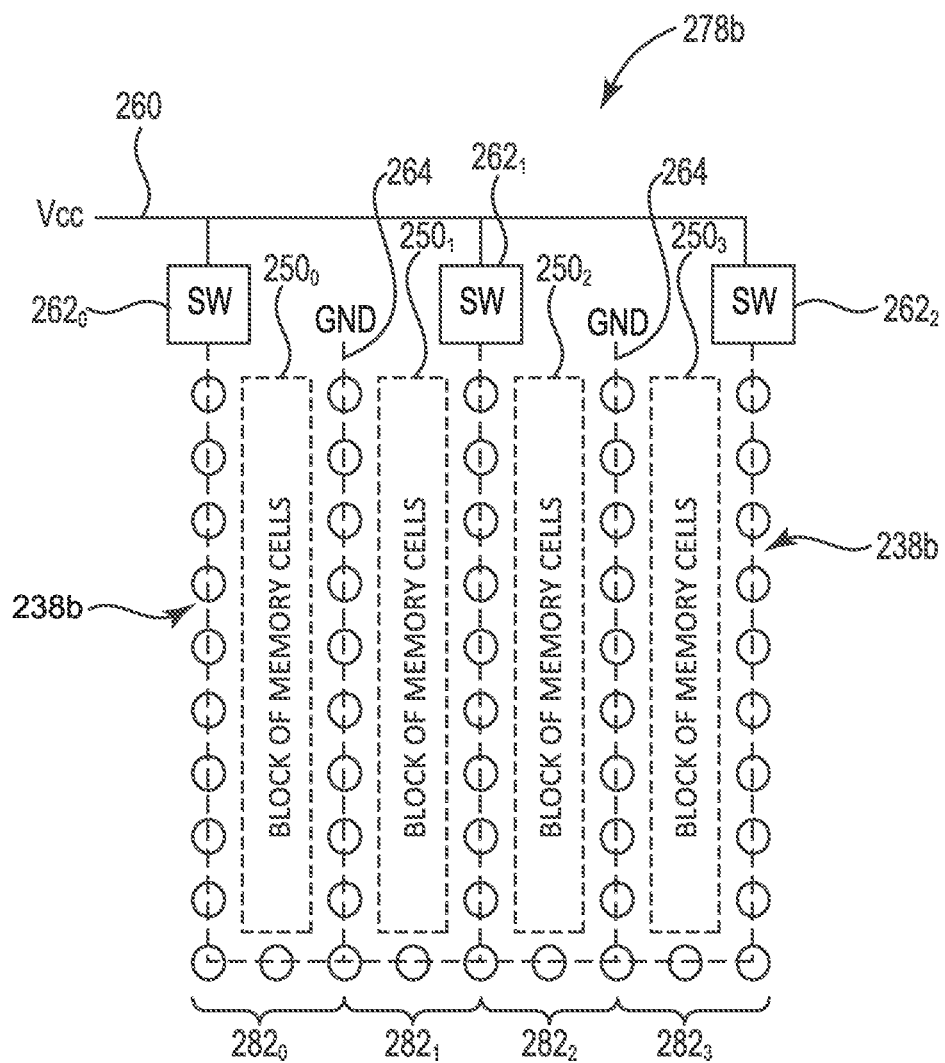

FIG. 5B is a top view of a memory device 278b including a plurality of blocks of memory cells $250_0$ to $250_3$, respective heaters $282_0$ to $282_3$, and switches $262_0$ to $262_2$. While four blocks of memory cells 250 and four corresponding heaters 282 are shown in FIG. 5B, in other embodiments, the memory device 278b may include another suitable number of blocks of memory cells 250 and corresponding heaters 282. In this embodiment, each heater $282_0$ to $282_3$ is similar to heater 238b previously described and illustrated with reference to FIG. 4B. Each heater $282_0$ to $282_3$ is adjacent to (e.g., partially surrounds) a respective block of memory cells $250_0$ to $250_3$. A subset of heaters (e.g., $282_1$ and $282_2$) include a first side adjacent to a first block of memory cells (e.g., $250_0$ and $250_1$, respectively) and a second side opposite to the first side adjacent to a second block of memory cells (e.g., $250_2$ and $250_3$, respectively). Thus, portions of a heater 282 may be shared by an adjacent heater. In this embodiment, where each heater 282 includes a plurality of TAVs, the plurality of TAVs between blocks of memory cells $250_0$ and $250_1$ is shared by both heaters $282_0$ and $282_1$. Likewise the plurality of TAVs between blocks of memory cells $250_1$ and $250_2$ is shared by both heaters $282_1$ and $282_2$, and the plurality of TAVs between blocks of memory cells $250_2$ and $250_3$ is shared by both heaters $282_2$ and $282_3$.

A power supply node (e.g., Vcc) 260 is electrically coupled to a first side of each switch $262_0$ to $262_2$. A second side of switch $262_0$ is electrically coupled to a first side of heater $282_0$. A second side of heater $282_0$/first side of heater $282_1$ is electrically coupled to a common or ground node 264. A second side of switch $262_1$ is electrically coupled to a second side of heater $282_1$/first side of heater $282_2$. A second side of heater $282_2$/first side of heater $282_3$ is electrically coupled to common or ground node 264. A second side of switch $262_2$ is electrically coupled to a second side of heater $282_3$. In this embodiment, switches 262 are configured such that up to two blocks of memory cells 250 may be annealed at the same time. In other embodiments, switches 262 may be configured such that any suitable number of blocks of memory cells 250 may be annealed at the same time. In the embodiment of FIG. 5B, block of memory cells $250_0$ may be annealed by turning on switch $262_0$ to pass a current through heater $282_0$ from the power supply node 260 to the common or ground node 264. Blocks of memory cells $250_1$ and $250_2$ may be annealed by turning on switch $262_1$ to pass a current through heaters $282_1$ and $282_2$ from the power supply node 260 to the common or ground node 264. Block of memory cells $250_3$ may be annealed by turning on switch $262_2$ to pass a current through heater $282_3$ from the power supply node 260 to the common or ground node 264.

Figure 6A:
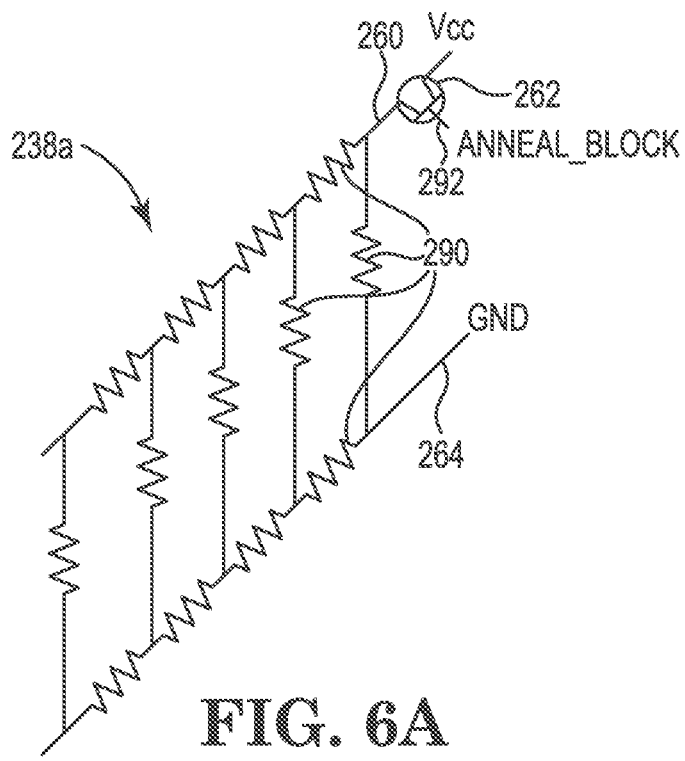
FIGS. 6A and 6B are schematics of heaters as could be used in a memory of the type described with reference to FIG. 1.

FIG. 6A is a schematic of a heater 238a as described with reference to FIG. 4A. Heater 238a may be represented as a plurality of resistors 290. The material(s) and dimensions of the heater 238a may be selected to provide a desired resistance (e.g., 100-150 Ohms) such that when a current is passed through the heater 238a, the heater generates a sufficient temperature (e.g., 100-120° C.) to anneal the adjacent block of memory cells. To reduce the time used to anneal a block of memory cells, the heater 238a may be configured to generate a higher temperature (e.g., 150° C.). Accordingly, the resistance of heater 238a, the period the heater is turned on, and the voltage applied to the heater via switch 262 may each be configured such that a sufficient temperature is generated by heater 238a for a sufficient time to anneal the adjacent block of memory cells.

In this embodiment, switch 262 is a BJT transistor switch including a collector-emitter path electrically coupled between the power supply node 260 and a first side of heater 238a and a base (e.g., control) input coupled to an anneal block control signal node 292. An anneal block signal on the anneal block control signal node 292 may be asserted (e.g., by control logic 116 of FIG. 1) to connect the voltage (e.g., 2 V) on the power supply node 260 to the heater 238a to pass a current through the heater 238a to the common or ground node 264.

Figure 6B:
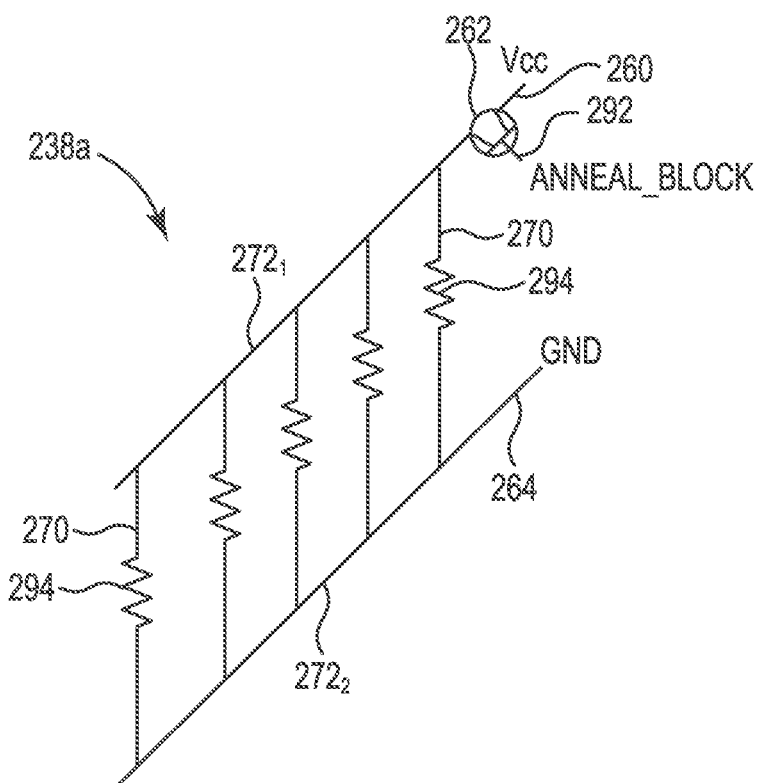

FIG. 6B is a schematic of a heater 238b as described with reference to FIG. 4B. Each TAV 270 of heater 238b may be represented as a resistor 294. Each resistor 294 is electrically coupled between a first conductor (e.g., electrically conductive layer) $272_1$ and a second conductor (e.g., electrically conductive layer) $272_2$. In this example, the resistance of the first conductor $272_1$ and the second conductor $272_2$ are considered to be negligible. The material(s) and dimensions of the heater 238b may be selected to provide a desired resistance (e.g., 100-150 Ohms) such that when a current is passed through the heater 238b, the heater generates a sufficient temperature (e.g., 100-120° C.) to anneal the adjacent block of memory cells. To reduce the time used to anneal a block of memory cells, the heater 238b may be configured to generate a higher temperature. Accordingly, the resistance of heater 238b, the period the heater is turned on, and the voltage applied to the heater via switch 262 may each be configured such that a sufficient temperature is generated by heater 238b for a sufficient time to anneal the adjacent block of memory cells.

In this embodiment, switch 262 is a BJT transistor switch including a collector-emitter path electrically coupled between the power supply node 260 and a first side of heater 238b and a base (e.g., control) input coupled to an anneal block control signal node 292. An anneal block signal on the anneal block control signal node 292 may be asserted (e.g., by control logic 116 of FIG. 1) to connect the voltage (e.g., 2 V) on the power supply node 260 to the heater 238b to pass a current through the heater 238b to the common or ground node 264.

Figure 7:
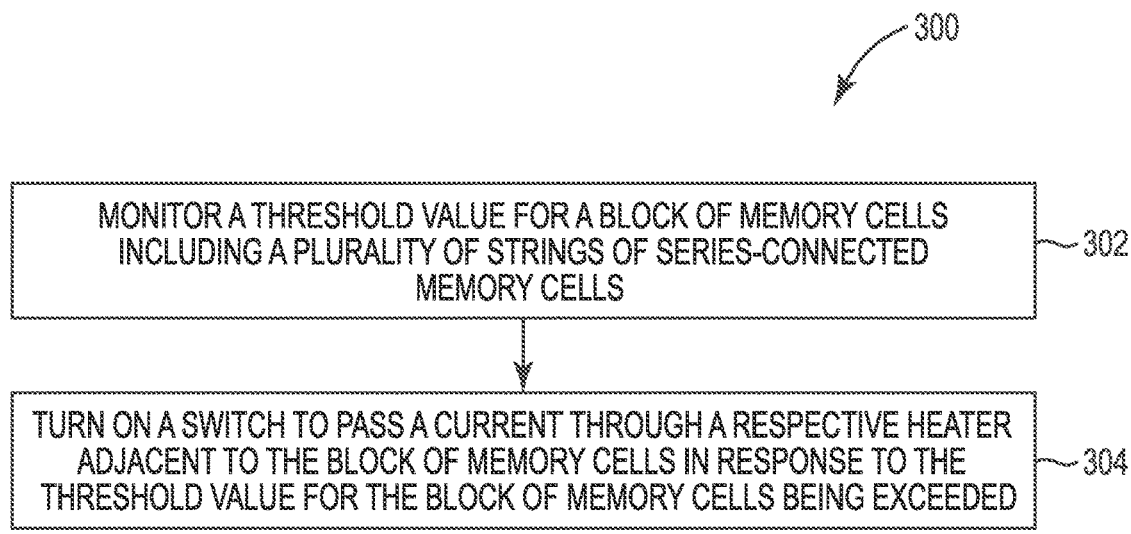
FIG. 7 is a flowchart of a method for operating a memory in accordance with an embodiment.

FIG. 7 is a flowchart of a method 300 for operating a memory in accordance with an embodiment. In one example, method 300 may be implemented by control logic 116 of FIG. 1. At 302, the control logic may monitor a threshold value for a block of memory cells including a plurality of strings of series-connected memory cells (e.g., NAND strings). In one example, the threshold value for the block of memory cells might include the number of program/erase cycles for the block of memory cells. In another example, the threshold value for the block of memory cells might include a maximum acceptable shift in a threshold voltage of the memory cells of the block of memory cells. In yet another example, the threshold value for the block of memory cells might include a read bit error rate for the memory cells of the block of memory cells.

At 304, the control logic may turn on a switch to pass a current through a respective heater adjacent to the block of memory cells in response to the threshold value for the block of memory cells being exceeded. In one example, the control logic might be configured to turn on the switch during an idle state of the block of memory cells. The control logic might be configured to turn on the switch for a predetermined period such that the heater anneals oxide within the block of memory cells to mitigate (e.g., remove) defects (e.g., traps) within the oxide. The heater may include an electrically conductive plate(s) as previously described and illustrated with reference to FIG. 4A or a plurality of electrically conductive TAVs as previously described and illustrated with reference to FIG. 4B.

When a block of memory cells is annealed, the data stored in the block of memory cells may be erased. Thus, prior to annealing a block of memory cells, the control logic may read the data stored in the block of memory cells. Subsequent to annealing the block of memory cells, the control logic may program the read data back into the block of memory cells. In this way, data loss due to the annealing may be prevented.

Figure 8:
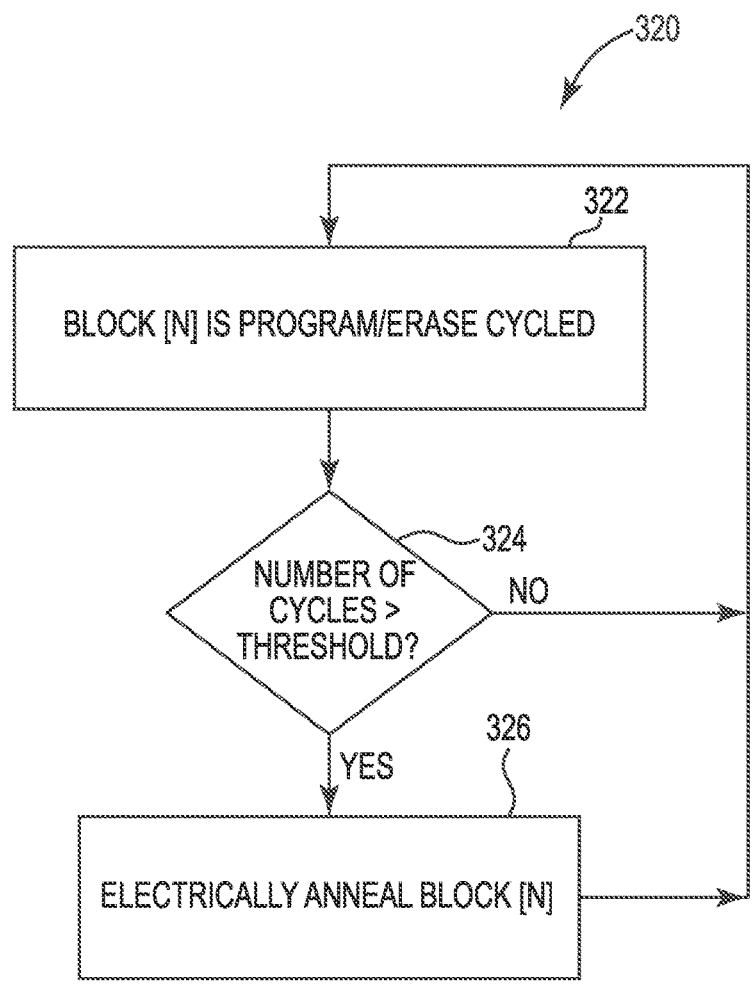
FIG. 8 is a flowchart of a method for operating a memory in accordance with another embodiment.

FIG. 8 is a flowchart of a method 320 for operating a memory in accordance with another embodiment. In one example, method 320 may be implemented by control logic 116 of FIG. 1. At 322, a block [N] of memory cells (e.g., a specific block of memory cells 250) is program/erase cycled. At 324, it is determined whether the number of program/erase cycles is greater than a threshold number of program/erase cycles. If the number of program/erase cycles is less than the threshold number of program/erase cycles, then block [N] of memory cells continues to be program/erase cycled at 322. If the number of program/erase cycles is greater than the threshold number of program/erase cycles, then at 326 block [N] is electrically annealed (e.g., via a corresponding heater 238).

In one example, the threshold number of program/erase cycles might equal 3,000 program/erase cycles or another suitable number of program/erase cycles where the integrity of the stored data becomes questionable. For memory devices not including heaters as disclosed herein, a block of memory cells might be retired after the threshold number of program/erase cycles has been reached. This is due to the number of defects within the block of memory cells reaching a number where the block of memory cells may no longer reliably store data. In contrast, for memory devices including the heaters as disclosed herein, a block of memory cells may be annealed to mitigate the defects, such that the block of memory cells may continue to be used. Accordingly, the life of the memory devices including heaters as disclosed herein may be extended beyond the life of memory devices not including heaters.

In addition, memory devices including heaters as disclosed herein may mitigate cross temperature (i.e., x-temp) reliability by using the heaters during cold temperatures. This may be useful for automotive applications or other applications where cold temperatures (e.g., below freezing) may be encountered.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
   an array of memory cells comprising a plurality of blocks of memory cells; and
   a plurality of heaters, each heater of the plurality of heaters adjacent to a respective block of memory cells of the plurality of blocks of memory cells,
   wherein each heater of the plurality of heaters comprises a first electrically conductive plate on a first side of the respective block of memory cells, a second electrically conductive plate on a second side of the respective block of memory cells, and a third electrically conductive plate on a third side of the respective block of memory cells extending between the first electrically conductive plate and the second electrically conductive plate.

2. The memory device of claim 1, further comprising:
   a ground node;
   a power supply node; and
   a plurality of switches, each switch of the plurality of switches electrically coupled between a first side of at least one respective heater of the plurality of heaters and one of the power supply node and the ground node,
   wherein the other one of the power supply node and the ground node is electrically coupled to a second side of each heater of the plurality of heaters.

3. The memory device of claim 1, wherein each heater of the plurality of heaters is configured to selectively anneal oxide within the respective block of memory cells to mitigate defects within the oxide.

4. The memory device of claim 1, wherein each heater of the plurality of heaters comprises doped polysilicon.

5. The memory device of claim 1, wherein each heater of the plurality of heaters comprises a metal.

6. The memory device of claim 1, wherein the second electrically conductive plate of a first heater of the plurality of heaters provides the first electrically conductive plate of a second heater of the plurality of heaters adjacent to the first heater.

7. A memory device comprising:
   an array of memory cells comprising a plurality of blocks of memory cells; and
   a plurality of heaters, each heater of the plurality of heaters adjacent to a respective block of memory cells of the plurality of blocks of memory cells,
   wherein each heater of the plurality of heaters comprises a first plurality of electrically conductive through-array vias (TAVs) on a first side of the respective block of memory cells, a second plurality of electrically conductive TAVs on a second side of the respective block of memory cells, and a third plurality of electrically conductive TAVs on a third side of the respective block of memory cells extending between the first plurality of electrically conductive TAVs and the second plurality of electrically conductive TAVs.

8. The memory device of claim 7, further comprising:
a ground node;
a power supply node; and
a plurality of switches, each switch of the plurality of switches electrically coupled between a first side of at least one respective heater of the plurality of heaters and one of the power supply node and the ground node, wherein the other one of the power supply node and the ground node is electrically coupled to a second side of each heater of the plurality of heaters.

9. The memory device of claim 7, wherein each heater of the plurality of heaters is configured to selectively anneal oxide within the respective block of memory cells to mitigate defects within the oxide.

10. The memory device of claim 7, wherein each heater of the plurality of heaters comprises doped polysilicon.

11. The memory device of claim 7, wherein each heater of the plurality of heaters comprises a metal.

12. The memory device of claim 7, wherein the second plurality of electrically conductive TAVs of a first heater of the plurality of heaters provides the first plurality of electrically conductive TAVs of a second heater of the plurality of heaters adjacent to the first heater.

13. A memory device comprising:
an array of memory cells;
a heater adjacent to the array of memory cells;
a power supply node;
a switch electrically coupled between the heater and the power supply node; and
control logic electrically coupled to a control input of the switch, the control logic configured to turn on the switch to pass a current through the heater in response to a threshold value for the array of memory cells being exceeded.

14. The memory device of claim 13, wherein the threshold value for the array of memory cells comprises a number of program/erase cycles for the array of memory cells.

15. The memory device of claim 13, wherein the threshold value for the array of memory cells comprises a maximum acceptable shift in a threshold voltage of memory cells of the array of memory cells.

16. The memory device of claim 13, wherein the threshold value for the array of memory cells comprises a read bit error rate for the array of memory cells.

17. The memory device of claim 13, wherein the control logic is configured to turn on the switch during an idle state of the array of memory cells.

18. The memory device of claim 13, wherein the control logic is configured to turn on the switch for a predetermined period such that the heater anneals oxide within the array of memory cells to mitigate defects within the oxide.

19. The memory device of claim 13, wherein the heater comprises an electrically conductive plate.

20. The memory device of claim 13, wherein the heater comprises a plurality of electrically conductive through-array vias (TAVs).

* * * * *